(12) United States Patent
Xuan et al.

(10) Patent No.: US 8,643,608 B2
(45) Date of Patent: Feb. 4, 2014

(54) OPTICAL TOUCH PANEL HAVING SMT COMPONENTS AS OPTICAL GATES

(75) Inventors: Hawaii W Y Xuan, Taipei (TW); Robert D. Parsons, Research Triangle Park, NC (US); Edward Y S Lee, Taipei (TW); Albert Lin, Lugu (TW)

(73) Assignee: International Business Machines Corporation, Armonk, NY (US)

( * ) Notice: Subject to any disclaimer, the term of this patent is extended or adjusted under 35 U.S.C. 154(b) by 496 days.

(21) Appl. No.: 12/495,011

(22) Filed: Jun. 30, 2009

(65) Prior Publication Data

US 2009/0322708 A1 Dec. 31, 2009

(30) Foreign Application Priority Data

Jun. 30, 2008 (TW) ................................ 97124640 A

(51) Int. Cl.
*G06F 3/041* (2006.01)

(52) U.S. Cl.
USPC ............................. 345/173; 345/174; 345/175

(58) Field of Classification Search
USPC .................................................. 345/173–175
See application file for complete search history.

(56) References Cited

U.S. PATENT DOCUMENTS

| | | | | |
|---|---|---|---|---|
| 4,198,623 A | * | 4/1980 | Misek et al. ................... 345/175 |
| 4,205,304 A | * | 5/1980 | Moore .............................. 341/5 |
| 4,243,879 A | * | 1/1981 | Carroll et al. ................. 250/221 |
| 4,267,443 A | * | 5/1981 | Carroll et al. ................. 250/221 |
| 4,713,534 A | * | 12/1987 | Masters et al. ............ 250/214 B |
| 4,737,631 A | * | 4/1988 | Sasaki et al. ................... 250/221 |
| 4,761,637 A | * | 8/1988 | Lucas et al. ........................ 341/5 |
| 4,799,044 A | * | 1/1989 | Masters et al. ..................... 341/5 |
| 4,837,430 A | * | 6/1989 | Hasegawa ..................... 250/221 |
| 4,847,606 A | * | 7/1989 | Beiswenger .................. 345/175 |
| 4,855,590 A | * | 8/1989 | Bures et al. .................... 250/221 |
| 4,943,806 A | * | 7/1990 | Masters et al. ................... 341/31 |
| 4,988,983 A | * | 1/1991 | Wehrer ......................... 345/175 |
| 4,990,901 A | * | 2/1991 | Beiswenger .................. 345/175 |
| 5,136,156 A | * | 8/1992 | Nounen et al. ................ 250/221 |
| 5,164,714 A | * | 11/1992 | Wehrer ......................... 345/175 |
| 5,577,733 A | * | 11/1996 | Downing ...................... 273/348 |
| 5,635,724 A | * | 6/1997 | Higgins ................... 250/559.19 |
| 5,933,349 A | * | 8/1999 | Dalgleish et al. ............. 700/121 |
| 5,988,645 A | * | 11/1999 | Downing ...................... 273/348 |
| 6,597,508 B2 | * | 7/2003 | Seino et al. .................... 359/618 |
| 6,677,934 B1 | * | 1/2004 | Blanchard ..................... 345/175 |
| 6,762,747 B2 | * | 7/2004 | Fujioka et al. ................ 345/157 |
| 6,836,367 B2 | * | 12/2004 | Seino et al. .................... 359/618 |

(Continued)

*Primary Examiner* — Amare Mengistu
*Assistant Examiner* — Sarvesh J Nadkarni
(74) *Attorney, Agent, or Firm* — The Steadman Law Firm PLLC; Thomas E. Tyson

(57) ABSTRACT

An optical touch panel and corresponding method are disclosed. The optical touch panel may comprise a rectangular position-detecting surface; a frame-shaped circuit board surrounding the rectangular position-detecting surface; a plurality of light-emitting elements configured for emitting a plurality of light beams, wherein the light-emitting elements are arranged along a first side of the rectangular position-detecting surface and disposed on the frame-shaped circuit board; a plurality of light-receiving elements configured for receiving light beams emitted by the plurality of light-emitting elements; a plurality of SMT components configured as optical gates for isolating ambient light to prevent erroneous light detection; and a control circuit. The plurality of SMT components and the plurality of light-receiving elements may be alternately arranged along a second side of the rectangular position-detecting surface opposite to the first side and disposed on the frame-shaped circuit board. The plurality of light-receiving elements may be arranged behind the plurality of SMT components.

16 Claims, 4 Drawing Sheets

(56) References Cited

U.S. PATENT DOCUMENTS

| | | | |
|---|---|---|---|
| 7,042,444 B2* | 5/2006 | Cok | 345/173 |
| 7,133,032 B2* | 11/2006 | Cok | 345/175 |
| 7,202,856 B2* | 4/2007 | Cok | 345/173 |
| 7,230,608 B2* | 6/2007 | Cok | 345/173 |
| 7,312,787 B2* | 12/2007 | Fujioka et al. | 345/156 |
| 7,362,320 B2* | 4/2008 | Payne et al. | 345/207 |
| 7,619,194 B2* | 11/2009 | Kobashi | 250/205 |
| 8,149,221 B2* | 4/2012 | Newton | 345/173 |
| 2003/0156332 A1* | 8/2003 | Seino et al. | 359/627 |
| 2004/0246689 A1* | 12/2004 | Espinoza-Ibarra et al. | 361/761 |
| 2005/0110767 A1 | 5/2005 | Gomes et al. | |
| 2005/0237317 A1* | 10/2005 | Cok | 345/207 |
| 2006/0162155 A1* | 7/2006 | Van Gastel | 29/833 |
| 2006/0221065 A1* | 10/2006 | Hong et al. | 345/175 |
| 2007/0165008 A1* | 7/2007 | Crockett | 345/175 |
| 2008/0060856 A1* | 3/2008 | Shahoian et al. | 178/18.03 |
| 2008/0062144 A1* | 3/2008 | Shahoian et al. | 345/173 |
| 2008/0062145 A1* | 3/2008 | Shahoian et al. | 345/173 |
| 2008/0111944 A1* | 5/2008 | Sakai | 349/61 |
| 2008/0203279 A1* | 8/2008 | Kobashi | 250/216 |
| 2009/0109193 A1* | 4/2009 | Masalkar | 345/175 |
| 2009/0244018 A1* | 10/2009 | Lin et al. | 345/173 |

\* cited by examiner

OPTICAL TOUCH PANEL HAVING SMT COMPONENTS AS OPTICAL GATES

RELATED APPLICATION

This application claims priority under 35 U.S.C. §119 to Taiwanese Patent Application No. 97124640 filed Jun. 30, 2008, the entire text of which is specifically incorporated by reference herein.

BACKGROUND OF THE INVENTION

The various embodiments described herein relate to an improved optical touch panel and more particularly to an infrared (IR) touch panel having surface mount technology (SMT) components such as thin film resistors or the like.

A variety of touch panel technologies are presently in existence, including resistive technology, capacitive technology, surface acoustical wave (SAW) technology, infrared (IR) technology, etc.

In the case of IR touch panel technology, infrared emitter/collector pairs are used to project an invisible grid of light a small distance over the surface of the panel. When a beam is interrupted, the absence of the signal at the collector is detected and converted to touch coordinates (e.g., X/Y rectangular coordinates). Since the method of determining the presence of an object is optical instead of electrical or mechanical, IR touch panels are not as sensitive to damage as some technologies, such as resistive and capacitive technologies.

The structure of a conventional optical touch panel is disclosed in U.S. Pat. No. 6,597,508, which is incorporated herein by reference. FIG. 1 depicts a conventional optical touch panel 101 as shown in the patent. The optical touch panel 101 comprises a plurality of light-emitting elements (e.g., LEDs) 110 arranged along two adjacent sides of a rectangular position-detecting surface 150 and a plurality of light-receiving elements (e.g., photo transistors) 130 arranged along the other two sides of the rectangular position-detecting surface 150 such that the light-emitting elements 110 are positioned opposite to the respective light-receiving elements 130 and the position-detecting surface 150 is positioned between the light-emitting elements 110 and the light-receiving elements 130.

A control block 140 causes the light-emitting elements 110 to emit light beams sequentially from left to right and from top to bottom. Moreover, the control block 140 causes the light-receiving elements 130 to receive light beams from the respective light-emitting elements 110 positioned opposite thereto. The light beams of the light-emitting elements 110 are sequentially scanned across the position-detecting surface 150 such that optical paths are formed on the position-detecting surface 150 in a grid pattern.

The touch coordinates can be determined according to which light-emitting elements 110 emit light beams and which light-receiving elements 130 sense such light beams during a scan cycle. When an object (e.g., a pointing device such as a touch pen or a finger) 170 is positioned on the position-detecting surface 150 as shown in FIG. 1, the object 170 blocks optical paths, thereby hindering light beams from the corresponding light-emitting elements 110 from reaching the corresponding light-receiving elements 130 positioned opposite to the light-emitting elements 110. As a result, the control block 140 determines the position of the object 170 in terms of two-dimensional coordinates (e.g., X/Y rectangular coordinates) based on information from the light-receiving elements 130 with respect to received light beams. If the object 170 also blocks the infrared light of adjacent rows and columns of the grid pattern, the intended center position can be obtained by averaging the coordinate information received by the relevant computing device.

The optical touch panel 101 requires an optical gate (i.e., light gate) for each light-receiving element 130 for the purpose of isolating ambient light (e.g., sunlight). Such optical gate is necessary to prevent erroneous light detection from being caused by ambient light, which potentially can hinder proper light detection from the corresponding light-emitting element 110. However, the conventional assembly process for an optical gate requires error-prone human assembly. Moreover, a conventional optical gate design can be expensive. Accordingly, it would be advantageous to provide a novel and less expensive solution for forming an optical gate for each light-receiving element without human assembly for the optical gate.

SUMMARY OF THE INVENTION

The various embodiments described herein provide an optical touch panel having surface mount technology (SMT) components (e.g., thin film resistors or the like) as optical gates (i.e., light gates). According to an exemplary embodiment, the optical touch panel may comprise a rectangular position-detecting surface. Moreover, the optical touch panel may comprise a plurality of light-emitting elements configured for emitting a plurality of light beams. The plurality of light-emitting elements may be arranged at various points along a first side of the rectangular position-detecting surface and may be disposed on a frame-shaped circuit board surrounding the rectangular position-detecting surface.

Additionally, the optical touch panel may comprise a plurality of light-receiving elements configured for receiving light beams emitted by the plurality of light-emitting elements. Furthermore, the optical touch panel may comprise a plurality of SMT components configured as optical gates for isolating ambient light (e.g., sunlight) to prevent erroneous light detection from being caused by such ambient light. The plurality of SMT components and the plurality of light-receiving elements may be alternately arranged at various points along a second side of the rectangular position-detecting surface opposite to the first side and disposed on the frame-shaped circuit board, and the plurality of light-receiving elements may be arranged at locations behind the plurality of SMT components.

The optical touch panel further may comprise a control circuit configured for causing the plurality of light-emitting elements to emit the plurality of light beams in a predetermined order for the purpose of scanning the position-detecting surface. The control circuit further may be configured for causing the plurality of light-receiving elements to receive the plurality of light beams, thereby forming optical paths on the position-detecting surface in a grid pattern. Moreover, the control circuit may be configured for causing the plurality of light-emitting elements to emit the plurality of light beams in a sequential order. Furthermore, the control circuit may be configured for causing a plurality of alternate light-emitting elements selected from the plurality of light-emitting elements to emit the plurality of light beams at a given time.

The various embodiments described herein provide a more precise and less expensive technique for forming an optical gate for each light-receiving element. Specifically, the various embodiments enable the use of a conventional SMT assembly process for the optical gates instead of error-prone human assembly. In addition, the various embodiments provide for the use of relatively less expensive SMT components for the optical gates in lieu of a relatively more expensive conventional plastic comb structure.

BRIEF DESCRIPTION OF THE DRAWINGS

The various embodiments will be described in detail with reference to the following figures, wherein.

DETAILED DESCRIPTION

Figure 1:
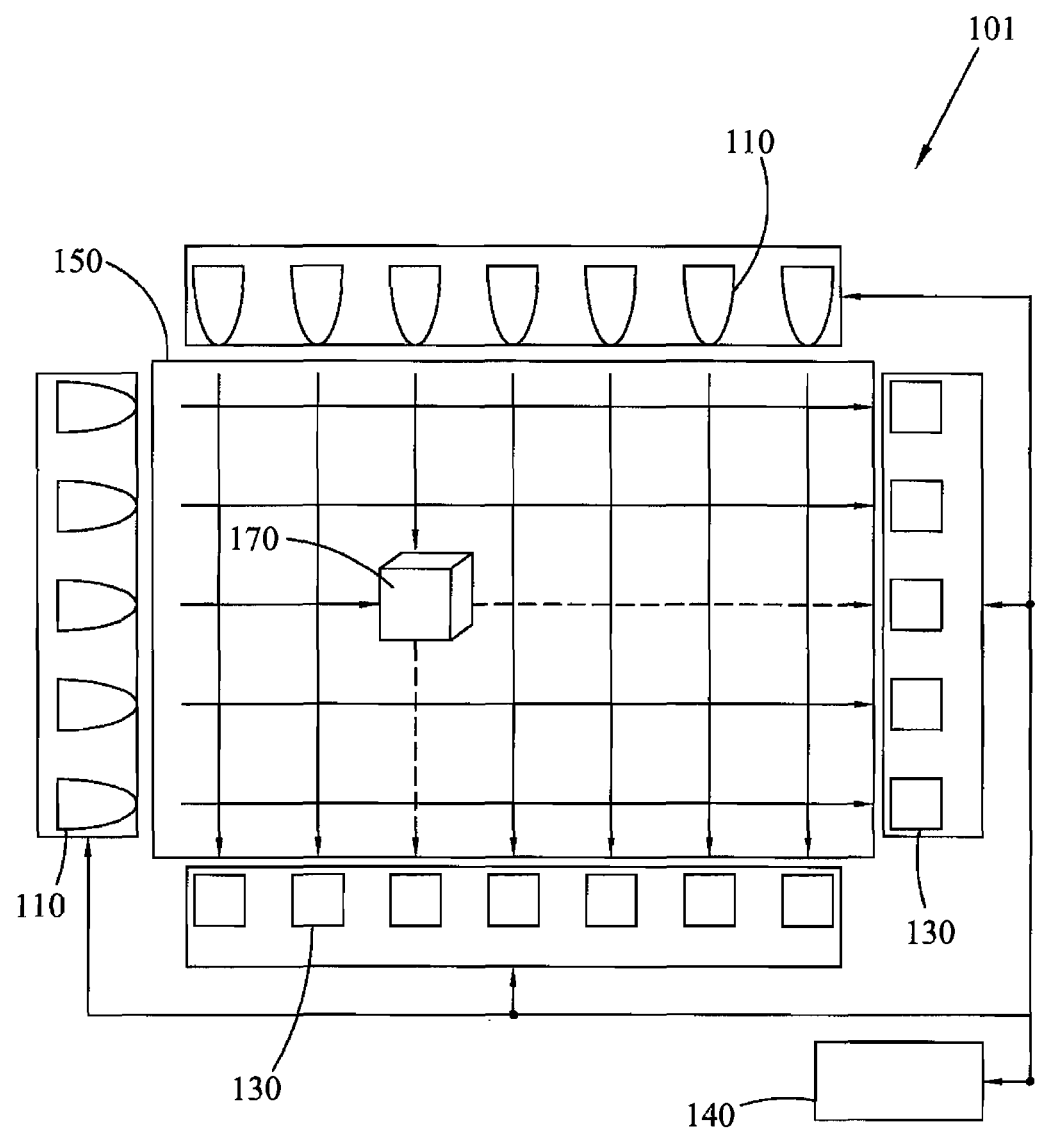
FIG. 1 provides an illustration depicting a conventional optical touch panel.

The following describes various exemplary embodiments. The disclosed embodiments are only for illustration. Thus, it will be understood by those skilled in the art that there are many modifications that may be made to the various embodiments described herein without departing from the spirit and scope of the disclosure. Throughout the drawings, similar features are identified by similar reference numerals.

Figure 2A:
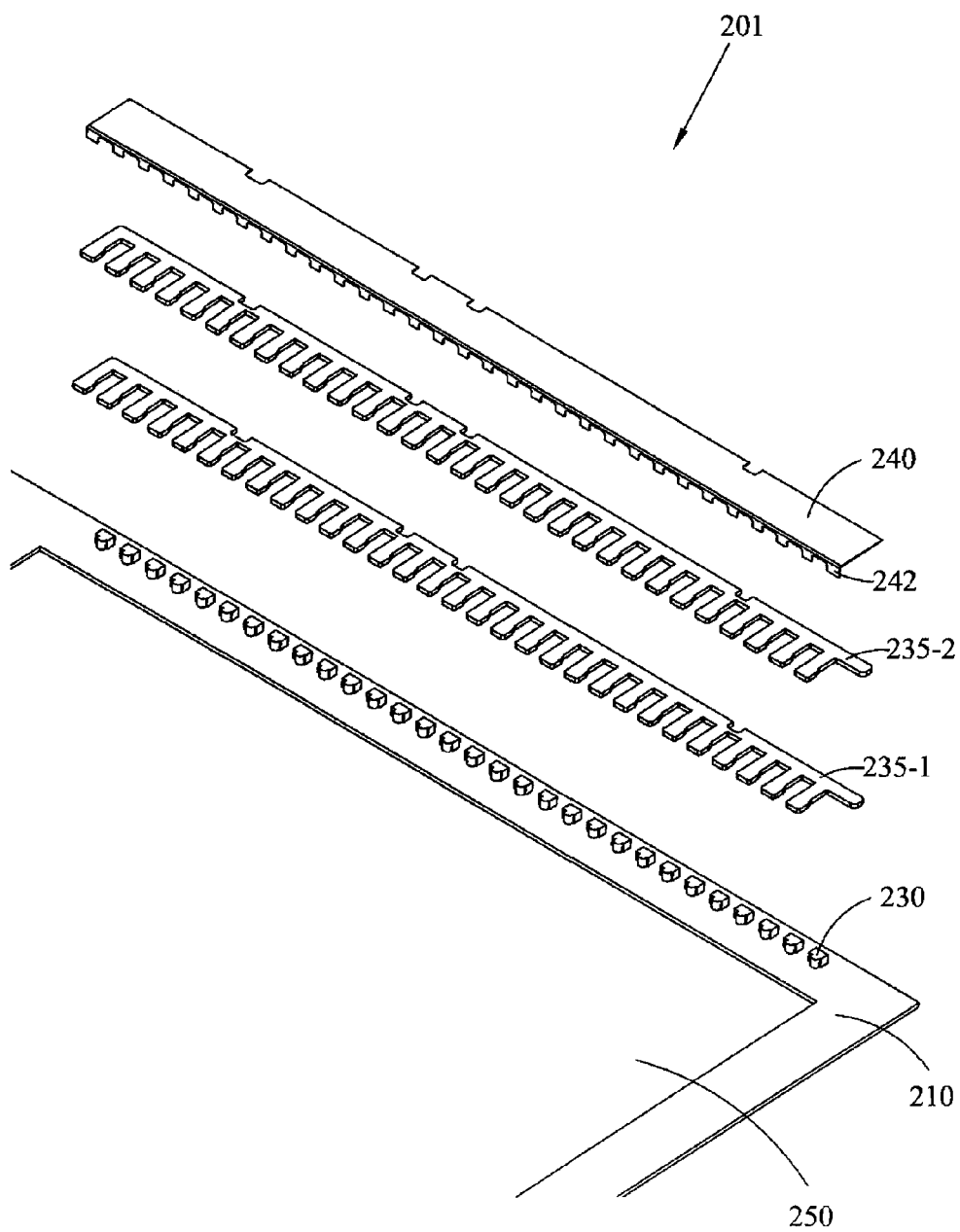
FIGS. 2a & 2b respectively provide a partial exploded perspective view and an assembled perspective view of a side of a conventional optical touch panel comprising optical gates in the form of a plastic comb structure.
Figure 2B:
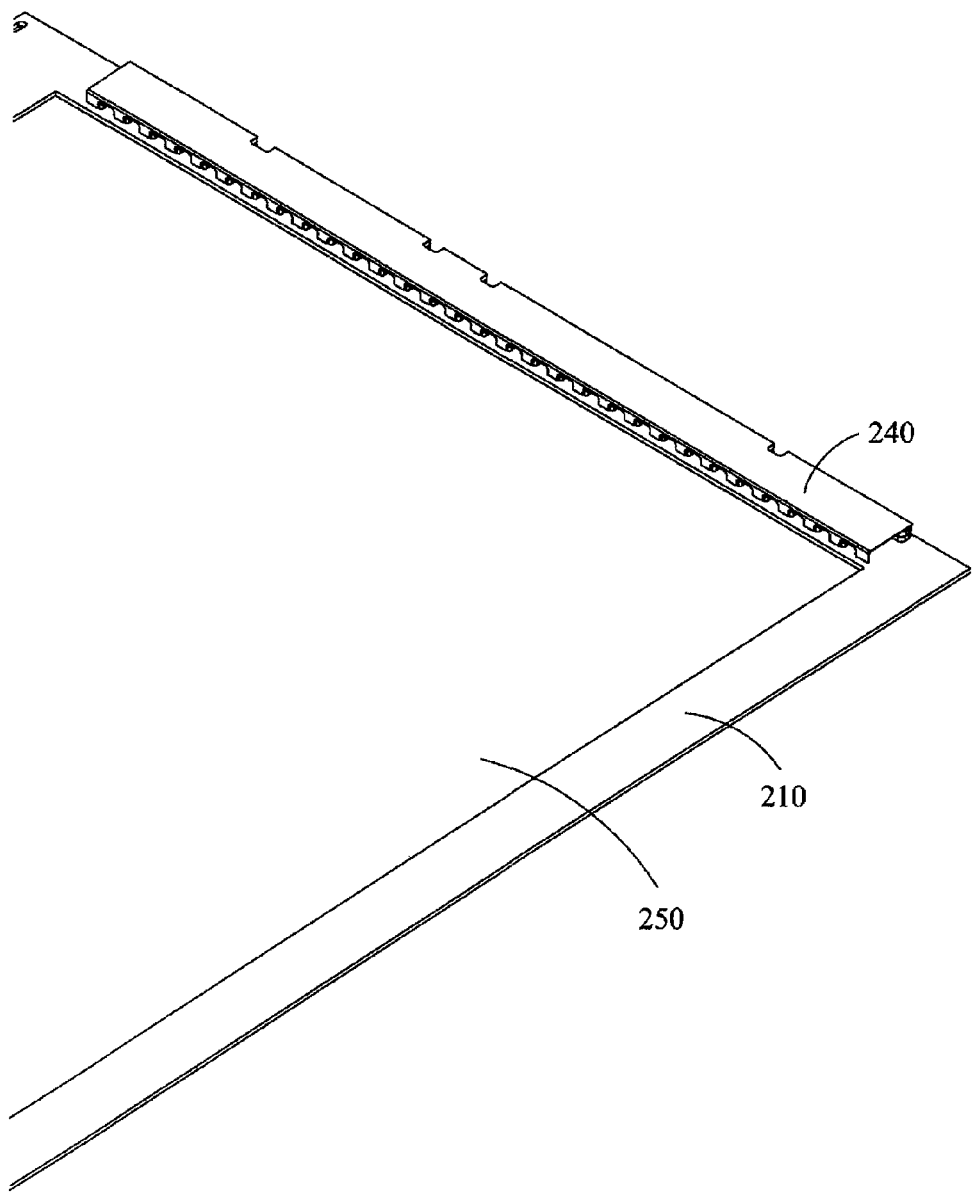

FIGS. 2a & 2b respectively provide a partial exploded perspective view and an assembled perspective view of a side of a conventional optical touch panel 201. As illustrated, the optical touch panel 201 comprises a plurality of light-receiving elements 230 arranged at various points along a side of a rectangular position-detecting surface 250. The plurality of light-receiving elements 230 are disposed on a frame-shaped circuit board 210 surrounding the rectangular position-detecting surface 250. The plurality of light-receiving elements 230 are configured for receiving light beams emitted by a plurality of light-emitting elements (not shown) positioned opposite thereto.

The optical touch panel 201 requires an optical gate (i.e., light gate) for each of the plurality of light-receiving elements 230 in order to prevent erroneous light detection from being caused by ambient light (e.g., sunlight). Accordingly, a plastic comb structure is arranged on the side of the optical touch panel 201 having the plurality of light-receiving elements 230 in order to provide an optical gate structure. The plastic comb structure comprises a plurality of plastic combs 235-1, 235-2 arranged around the plurality of light-receiving elements 230 such that each of the plurality of light-receiving elements 230 is separated from one another. Each of the plurality of plastic combs 235-1, 235-2 comprises teeth that facilitate separation of the plurality of light-receiving elements 230. To assemble the plastic comb structure, a plastic top plate 240 is mated to the plurality of plastic combs 235-1, 235-2 in order to provide adequate thickness to separate each light-receiving element 230. Specifically, a jagged front edge 242 of the plastic top plate 240 is mated to the teeth of the plurality of plastic combs 235-1, 235-2 via gluing or a similar process. After assembly, each of the plurality of light-receiving elements 230 is located within a recess between the teeth of the plastic combs 235-1, 235-2. Accordingly, the assembled plastic comb structure provides optical gates to block ambient light, thereby preventing undesired interference caused by ambient light from reaching the plurality of light-receiving elements 230. Furthermore, ambient light coming from above the assembly is blocked by a front cover (not shown) housing the frame-shaped circuit board 210. Such a front cover is used in a conventional manner known to those skilled in the art.

The assembly process of the conventional optical touch panel as depicted FIGS. 2a and 2b will now be described. First, each of the plurality of light-receiving elements 230 is disposed on the frame-shaped circuit board 210 by utilizing known SMT technology. Then, the plastic combs 235-1, 235-2 are precisely mated to the plastic top plate 240 via human operators. Such mating may be accomplished by gluing. Finally, the plastic comb structure is disposed on the frame-shaped circuit board 210. Accordingly, the conventional optical touch panel requires two processes: (1) disposing the plurality of light-receiving elements 230 via a SMT process and (2) mating and disposing the plastic comb structure via human assembly. The involvement of human operators necessitated by human assembly may increase assembly cost and may result in human error. Moreover, the plastic combs necessary for the plastic comb structure are relatively expensive.

Figure 3:
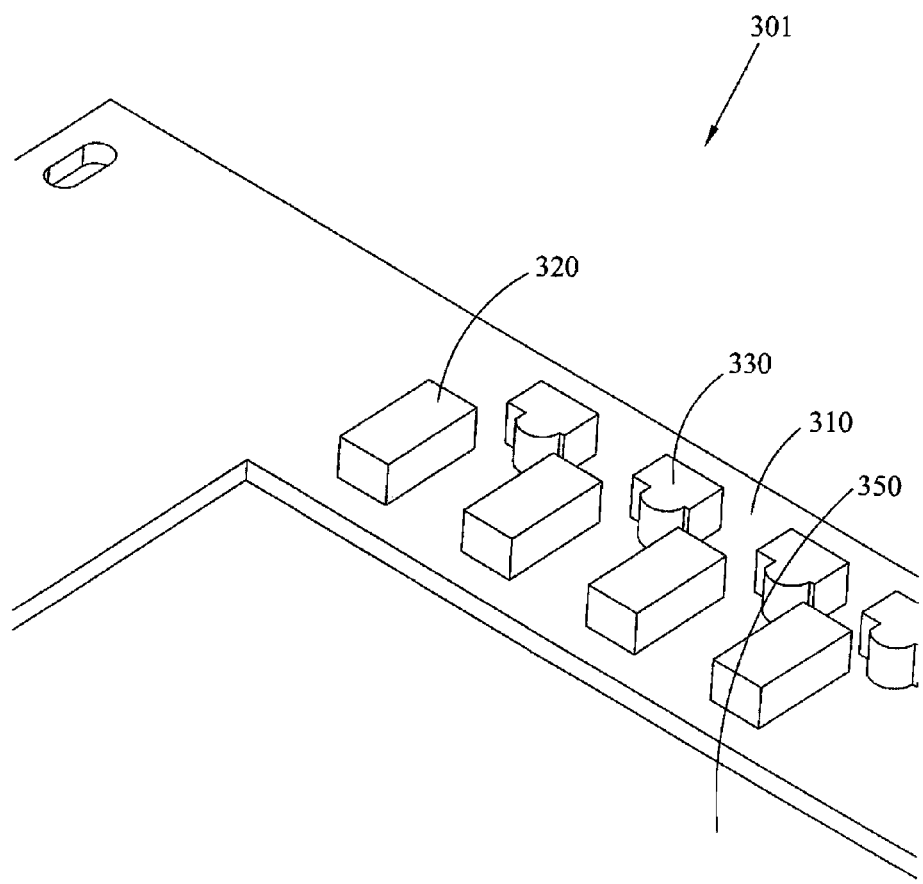
FIG. 3 provides a perspective view of a side of an optical touch panel comprising optical gates in the form of SMT components in accordance with an exemplary embodiment.

FIG. 3 provides a perspective view of a side of an optical touch panel 301 in accordance with an exemplary embodiment. As illustrated, the optical touch panel 301 may comprise a plurality of light-receiving elements 330 arranged at various points along a side of a rectangular position-detecting surface 350. The plurality of light-receiving elements 330 may comprise photo transistors or the like. In addition, the plurality of light-receiving elements 330 may be configured for receiving light beams emitted by a plurality of light-emitting elements (not shown) positioned opposite thereto. The plurality of light-emitting elements may comprise light emitting diodes (LEDs) or the like. Moreover, as illustrated, the optical touch panel 301 may comprise a plurality of SMT components 320 to be used as optical gates. The plurality of SMT components 320 may be any form of physical block that is disposable using known SMT technology (e.g., a thin film resistor or the like). The plurality of SMT components 320 and the plurality of light-receiving elements 330 may be alternately arranged at various points along the aforementioned side of the rectangular position-detecting surface 350 and may be disposed on the frame-shaped circuit board 310. The plurality of light-receiving elements 330 may be arranged at locations behind the plurality of SMT components 320. Accordingly, the plurality of SMT components 320 may function as optical gates to block ambient light, thereby preventing undesired interference caused by ambient light from reaching the plurality of light-receiving elements 330. Furthermore, ambient light coming from above the assembly may be blocked by a front cover (not shown) housing the frame-shaped circuit board 310. Such a front cover may be used in a conventional manner known to those skilled in the art.

The plurality of SMT components 320 used as optical gates may be disposed on the frame-shaped circuit board 310 by utilizing known SMT technology. For instance, as known to those skilled in the art, the SMT components 320 may be disposed on the frame-shaped circuit board 301 via a reflow soldering process. Similarly, the plurality of light-receiving elements 330 may be disposed on the frame-shaped circuit board 310 at locations behind the plurality of SMT components 320 by utilizing known SMT technology. Accordingly, the plurality of SMT components 320 and the plurality of light-receiving elements 330 may be disposed simultaneously on the frame-shaped circuit board 310 using a single process utilizing known SMT technology, without human involvement. As a result, the plurality of SMT components 320 used as optical gates in accordance with an exemplary embodiment may be disposed on the frame-shaped circuit board 310 more precisely than the aforementioned conventional optical gate structure using mated plastic combs. Moreover, compared with the conventional optical gate structure, assembly costs associated with human operators may be eliminated, and material costs may be reduced by replacing the plastic combs with relatively less expensive SMT components.

In sum, in accordance with the various embodiments, the plurality of SMT components 320 may function as optical gates configured for blocking ambient light, and conventional SMT technology may be used for all necessary assembly. Accordingly, the various embodiments disclose a more precise and a less expensive technique for forming an optical gate for each of a plurality of light-receiving elements disposed on an optical touch panel.

Various modifications and rearrangements may be made to the various embodiments without departing from the scope of the disclosure. For example, any type of SMT component may be used so long as such SMT component has a physical structure capable of blocking ambient light sufficiently in accordance with the various embodiments.

The illustration of the various embodiments herein with reference to the drawings is provided for a better understanding of the characteristics and spirit of the various embodiments. It will be understood that the various embodiments are not limited to the exemplary embodiments described herein but rather are capable of various modifications and rearrangements without departing from their scope. Therefore, it is intended that the following claims, accompanied by detailed descriptions giving the broadest explanation, not only define the scope of the various embodiments but also cover all such modifications and changes that fall within their true spirit and scope.

The invention claimed is:

1. An optical touch panel comprising:
a rectangular position-detecting surface;
a frame-shaped circuit board surrounding the rectangular position-detecting surface;
a plurality of light-emitting elements configured for emitting a plurality of light beams, wherein the plurality of light-emitting elements are arranged at various points along a first side of the rectangular position-detecting surface and disposed on the frame-shaped circuit board;
a plurality of light-receiving elements configured for receiving the plurality of light beams emitted by the plurality of light-emitting elements;
a plurality of surface mount technology (SMT) components configured as optical gates for isolating ambient light to prevent erroneous light detection, wherein the plurality of SMT components comprise thin film resistors; and
a control circuit configured for causing the plurality of light-emitting elements to emit the plurality of light beams in a predetermined order and further configured for causing the plurality of light-receiving elements to receive the plurality of light beams, thereby forming optical paths on the position-detecting surface in a grid pattern;
wherein the plurality of SMT components and the plurality of light-receiving elements are alternatively arranged at various points along a second side of the rectangular position-detecting surface opposite to the first side and disposed on the frame-shaped circuit board, and wherein the plurality of light-receiving elements are arranged at locations behind the plurality of SMT components.

2. The optical touch panel according to claim 1, wherein the control circuit is further configured for causing the plurality of light-emitting elements to emit the plurality of light beams in a sequential order.

3. The optical touch panel according to claim 1, wherein the control circuit is further configured for causing a plurality of alternate light-emitting elements selected from the plurality of light-emitting elements to emit the plurality of light beams at a given time.

4. The optical touch panel according to claim 1, wherein the plurality of light-emitting elements comprise light emitting diodes.

5. The optical touch panel according to claim 1, wherein the plurality of light-receiving elements comprise photo transistors.

6. The optical touch panel according to claim 1, wherein if more than two of the plurality of light beams are blocked by an object, coordinates of an intended center position of the object are determined by averaging detected coordinate information.

7. The optical touch panel according to claim 1, wherein the plurality of SMT components are disposed on the frame-shaped circuit board via a reflow soldering process.

8. The optical touch panel according to claim 1, wherein the plurality of SMT components and the plurality of light-receiving elements are disposed simultaneously on the frame-shaped circuit board via a single SMT assembly process.

9. A method of forming optical gates on a side of an optical touch panel, the method comprising:
disposing a plurality of surface mount technology (SMT) components and a plurality of light-receiving elements on a frame-shaped circuit board surrounding a rectangular position-detecting surface of the optical touch panel, wherein the plurality of SMT components comprise thin film resistors, and wherein the plurality of light-receiving elements are arranged at locations behind the plurality of SMT components such that the plurality of SMT components are configured as optical gates to prevent undesired interference caused by ambient light from reaching the plurality of light-receiving elements.

10. The method according to claim 9, wherein the plurality of light-receiving elements comprise photo transistors.

11. The method according to claim 9, wherein the plurality of SMT components are disposed on the frame-shaped circuit board via a reflow soldering process.

12. The method according to claim 9, further comprising:
disposing a plurality of light-emitting elements on the frame-shaped circuit board; and
causing the plurality of light-emitting elements to emit a plurality of light beams in a sequential order.

13. The method according to claim 12, further comprising causing a plurality of alternate light-emitting elements selected from the plurality of light-emitting elements to emit the plurality of light beams at a given time.

14. The method according to claim 12, wherein the plurality of light-emitting elements comprise light emitting diodes.

15. The method according to claim 12, further comprising, upon determining that more than two of the plurality of light beams are blocked by an object, determining coordinates of an intended center position of the object by averaging detected coordinate information.

16. The method according to claim 9, wherein the plurality of SMT components and the plurality of light-receiving elements are disposed simultaneously on the frame-shaped circuit board via a single SMT assembly process.

* * * * *